United States Patent
Kanakasabapathy et al.

(10) Patent No.: US 7,442,647 B1
(45) Date of Patent: Oct. 28, 2008

(54) STRUCTURE AND METHOD FOR FORMATION OF CLADDED INTERCONNECTS FOR MRAMS

(75) Inventors: Sivananda Kanakasabapathy, Niskayuna, NY (US); Eugene J. O'Sullivan, Nyack, NY (US); Michael Christopher Gaidis, Wappingers Falls, NY (US); Michael Francis Lofaro, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/043,129

(22) Filed: Mar. 5, 2008

(51) Int. Cl.
    *H01L 21/311* (2006.01)
(52) U.S. Cl. .................. 438/694; 438/700; 438/702; 438/720
(58) Field of Classification Search ............. 438/689, 438/694, 700, 702, 706, 710, 714, 720, 724, 438/725
    See application file for complete search history.

(56) References Cited

U.S. PATENT DOCUMENTS

| | | | |
|---|---|---|---|
| 5,447,599 A | | 9/1995 | Li et al. |
| 5,569,617 A | * | 10/1996 | Yeh et al. ................... 438/3 |
| 5,640,343 A | | 6/1997 | Gallagher et al. |
| 6,509,276 B2 | | 1/2003 | Scott |
| 6,559,511 B1 | * | 5/2003 | Rizzo ...................... 257/421 |
| 6,666,983 B2 | | 12/2003 | Marietti et al. |
| 6,693,825 B1 | * | 2/2004 | Sharma et al. ............. 365/158 |
| 6,759,332 B2 | | 7/2004 | Clevenger et al. |
| 7,019,399 B2 | | 3/2006 | Venkatraman et al. |
| 7,060,196 B2 | | 6/2006 | Makarov et al. |
| 7,287,325 B2 | | 10/2007 | Chanda et al. |
| 2001/0050859 A1 | * | 12/2001 | Schwarzl ................. 365/158 |
| 2004/0063223 A1 | * | 4/2004 | Costrini et al. ............... 438/3 |
| 2006/0022237 A1 | * | 2/2006 | Byun et al. ................. 257/295 |
| 2006/0172439 A1 | * | 8/2006 | Leuschner ................... 438/3 |
| 2008/0016675 A1 | * | 1/2008 | Byun et al. .............. 29/603.18 |

OTHER PUBLICATIONS

Anonymous (IBM), "Noble Metal Cap for BEOL Applications", IPCOM000149688D, Apr. 4, 2007.

* cited by examiner

*Primary Examiner*—Kin-Chan Chen
(74) *Attorney, Agent, or Firm*—PRTSI, Inc.; Martin D. Moynihan

(57) ABSTRACT

A structure and method for fabricating a top strap in a magnetic random access memory, MRAM, comprising a damascene process forming a trench in a dielectric layer and resulting in a metal conductor clad on three sides by an inverted U-shape trench liner and cap made up of three layers consisting of a stack of a ferromagnetic material sandwiched between two layers of a refractory metal or an alloy of a refractory metal. First the two sidewalls of the trench are formed with the cladding layer, followed by filling the trench with the metal conductor. In preparing the structure for the capping layer, the metal conductor is recessed with an etch that is selective to the metal conductor over the sidewall stack. This preparation may be performed on selected metal filled trenches and blocked on others, such that after a final polishing step, only those metal conductors that received the recess operation will have the capping layer.

1 Claim, 2 Drawing Sheets

Top Strap, FML (field) & Liner Polish

Trench Etch
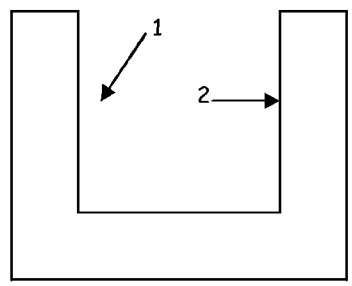
Figure 1
Liner & FML Dep
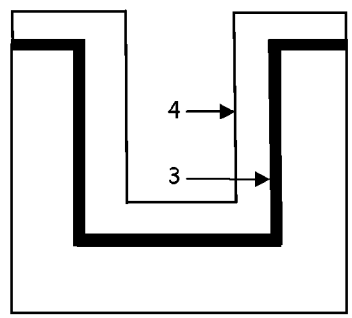
Figure 2
FML Sidewall Spacer IBE
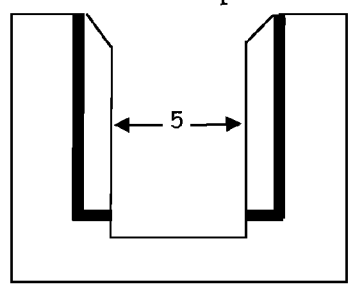 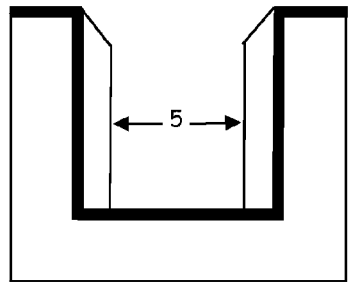
Figure 3a                Figure 3b
Liner Dep, Seed Dep, Cu Plate and Cu
Polish stopping on the Liner
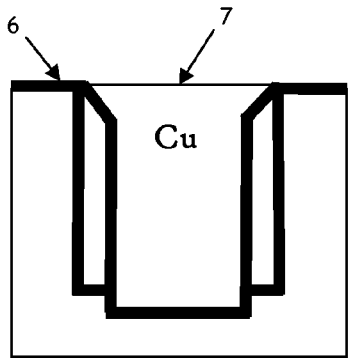
Figure 4

Cu Recess selective against Liner

Liner, Top Strap FML and Liner Dep

Top Strap, FML (field) & Liner Polish

Recess Masking

STRUCTURE AND METHOD FOR FORMATION OF CLADDED INTERCONNECTS FOR MRAMS

FIELD OF THE INVENTION

The present invention is in the area of fabricating Magnetic Random access memories (MRAM). More specifically, it teaches structures and processes by which one can integrate ferromagnetic liners to either concentrate or deflect magnetic flux lines from adjacent current carrying wires onto or away from Tunnel Junction elements.

BACKGROUND OF THE INVENTION

The Magnetic Tunnel Junction (MTJ) element is positioned at the intersection points of an orthogonal grid pattern formed by the Word and Bit lines in MRAM arrays. Typically, but not necessarily, this cross-point cell architecture (Ref: U.S. Pat. No. 5,640,343, Gallagher et al.) has the bit lines running atop the tunnel junctions and the word lines below, or, in another embodiment, has the word lines running atop the tunnel junctions and the bit lines below.

The bit is switched by the combination of magnetic lines of flux generated by two wires, wherein, at the intersection of which is a uniquely addressable MTJ.

Ferromagnetic Liners (FML) integrated with the wordlines and bitlines enhance MRAM array performance by several means, namely, by allowing lower power consumption for a given switching flux requirement at the tunnel junction, by attenuating nearest neighbor effects and hence aid in tighter packing densities, and by attenuating external stray fields. It is not enough if these word lines and bit lines are clad on two sides. Cladding them on the third side such that the side that is not clad faces the MTJ, enhances the ability of the ferromagnetic liner to steer flux into the MTJ and away from the nearest neighbors. This requires that the bottom lines have a "U" shaped FML, while the top lines require an inverted "U" shaped FML.

We teach herein the art of forming a top strap to the top wordlines so as to achieve an inverted U shaped FML.

SUMMARY OF THE INVENTION

The invention teaches a method and associated structure in the fabrication of ferromagnetic liners in the integration of Magnetic Random Access Memories (MRAM). Specifically, it teaches a technique of forming the top strap required to close magnetic circuit for the lines of flux on the side opposing the MTJ in the wire atop. In forming the top strap, a method of forming interconnects, said interconnects comprising four sides, clad, on at least three of the four sides with a self-aligned liner, in a dielectric layer, said dielectric layer comprising a top and a bottom surface and formed over a semiconductor substrate surface, said method, is taught.

Formation of the strap begins with the etching of one or more trenches in the top surface of the dielectric layer, each trench comprising two sides and a bottom. The next step is coating the one or more trenches and the top surface of the dielectric layer with a first stack, said first stack comprising one of more layers, wherein at least one of the said one or more layers comprises a ferromagnetic material, to form a first liner.

The next step is anisotropically etching the first liner stack to remove at least the ferromagnetic layer from the horizontal surfaces of the trench bottoms and the top surface of the dielectric layer to form sidewall spacers in the one or more trenches. Then a coating to at least the top surface of the dielectric layer with a refractory material is applied to form a second liner, followed by filling the one or more trenches with a metal conductor and polishing the metal conductor, stopping on the second liner on the top surface of the dielectric. Recessing the metal conductor of one or more selected metal filled trenches occurs next by selectively etching the metal conductor of the one or more selected metal filled trenches, said selective etching being selective to the sidewall spacers. Next a second stack, comprising one or more layers, wherein at least one of said one or more layers comprises a second ferromagnetic layer, is formed over the top surface of the dielectric layer and over the one or more metal filled trenches to form a third liner, followed by polishing with a chemical-mechanical polish removing the second stack from the top surface of the dielectric layer and any non-recessed metal filled trenches while leaving the second stack over the recessed one or more selected metal filled trenches to form a capping layer over the recessed one or more selected metal filled trenches and a planar surface.

BRIEF DESCRIPTION OF THE DRAWINGS

FIG. 1 shows the formation of a trench in a dielectric layer.

FIG. 2 shows the trench in the dielectric layer with a refractory liner layer and a ferromagnetic layer.

FIG. 3a shows the trench in the dielectric layer with the two liners etched from the horizontal layers leaving the liners on the sidewalls of the trench.

FIG. 3b shows the option of etching the two liners from the horizontal layers of the surface of the dielectric layer and etching the ferromagnetic layer from the bottom of the trench while leaving the refractory liner layer on the trench bottom.

FIG. 4 shows the liner deposition, seed deposition, and copper plating.

DESCRIPTION OF THE INVENTION

Figure 5:
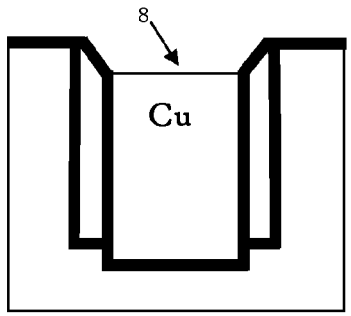
FIG. 5 shows the copper recessed below the refractory liner to a sufficient depth.

Damascene trench formation and the subsequent metallization to achieve BEOL interconnects is well know in the art of Semiconductor fabrication. MRAM arrays are achieved by integrating such damascene wiring in conjunction with Magnetic Tunnel Junctions in a cross-point cell fashion. This allows one to uniquely address a MTJ that is placed at the intersection of two orthogonal wires that are energized. (Ref: Gallagher patent).

The combination of the fields generated by the two wires switches the addressed Tunnel Junction (TJ) while the fields individually are not sufficient to switch the half-selected bits (in the same row OR column as the addressed bit).

The magnetic flux density generated by the wires for a given current can be enhanced by covering three sides of the wires with a ferromagnetic Liner. Conventional BEOL integration does have the Copper wires covered by refractory (Ta & TaN). Whereas the three sides of refractory liner coverage are the same as the three sides of required coverage for the ferromagnetic liners in the case of the bottom bit lines. The top word lines however require to be capped by a ferromagnetic liner on the top (Inverted U shape) as opposed to the conventional refractory liner (U shaped). In addition to the conventional refractory liner on three sides it is desirable to isolate the Ferromagnetic Liner from the Cu wiring. Hence the top wires (word lines) require refractory cladding on all 4 sides. Herein we disclose a technique to achieving such a structure and a method to achieving the same.

An exemplary embodiment of the invention is provided as shown in FIGS. 1 through 7. Referring to FIGS. 1 thru 3, the ferromagnetic liner on the sidewalls is formed. In FIG. 1 a trench 1 is etched into an interlayer dielectric, ILD, layer 2. The trench is then coated with a refractory liner 3 and then a ferromagnetic liner 4, as shown in FIG. 2. In FIG. 3a an anisotropic etch of the liner stack results in a sidewall spacers 5 of the refractory material while removing said ferromagnetic material and refractory material from the horizontal reaches of the trench bottom and the field area. Optionally, in FIG. 3b, the ferromagnetic liner 4, only, is anisotropically etched, removing the ferromagnetic liner 4 from the horizontal reaches of the trench bottom and the field area, while leaving the refractory liner 3. This is followed by a conventional liner deposition 6 of a refractory material to form a sidewall stack of the ferromagnetic material sandwiched between two layers of a refractory material followed by metallization 7, preferably copper, of a conductive metal, to fill the trench.

FIG. 4 shows how a subsequent CMP process is stopped after Cu removal but with the refractory material unpolished and still intact.

At this point as shown in FIG. 5, the surface of the Cu is recessed 8 below the refractory liner in the field to a predetermined depth. Selective etching of copper with little erosion of the refractory liner is possible though the process of any one of many known methods of selective etching including, but not limited to ion milling, wet etching, or an oxygen-RIE process which includes sputtering with an admixing of an oxygen containing material such as oxygen, Ozone, CO, CO2, NO, N2O and in general any gas that upon dissociation releases oxygen. Oxygen allows the formation of a refractory metal oxide or oxynitride. These films form selectively over the refractory material and not over the copper. Refractory oxides and oxynitrides offer greater etch resistance to the underlying films than Copper oxides.

Figure 7:
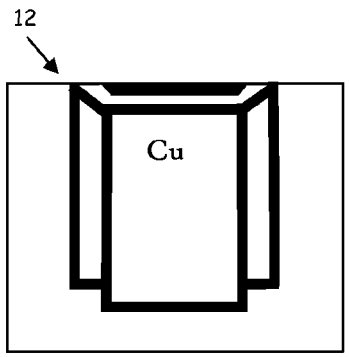
FIG. 7 shows the work piece is polished such that the capping layer in the non-recessed areas are removed.

The depth of Cu recess is chosen such that upon deposition of another refractory liner layer 9, ferromagnetic liner layer 10, and refractory liner layer 11, forming a tri-layer capping sandwich, the topmost metal layer 11 is still a sufficient distance from a polish pad used for polishing away the said tri-layer capping sandwich in the field. In another embodiment of this method, one can use a hard pad CMP to reduce dishing into the recessed trench. Also in a preferred structure, the top layer of the ILD incorporates a polish stop layer such as SiC (nBLoK) or Diamond like Carbon (DLC). Such polish stop layers (low polish rate) allow over polishing to remove the liner in the open field so as to reduce intra level shorts. This finally results in a structure having a planar surface 12 as shown in FIG. 7.

In a further exemplary embodiment of the invention, selective capping of the memory array is taught. In an application where MRAM is embedded into a chip with other circuitry, not all wires in the level that support the memory wires would belong to the memory array. There could be wiring that is purely meant for interconnecting transistors in the Front end without any TJ switching roles. It is not desirable to cap these with ferromagnetic liners since the added inductance could reduce the interconnect speed in those logic wires. In order to achieve such selective top strapping of the memory wires, the process flow is modified at the stage of processing, following FIG. 4.

Figure 6:
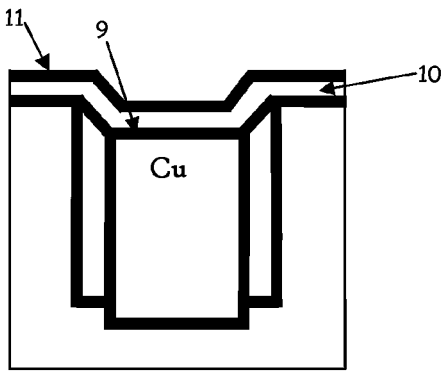
FIG. 6 shows the capping layer consisting of a ferromagnetic layer for the top strap deposited with optional top and bottom refractory liners.
Figure 8A:
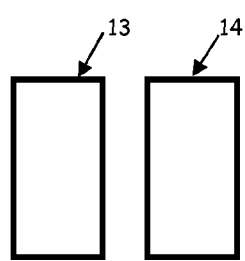
FIGS. 8a-8c show the option of selective blocking the recess etch so as to achieve selective capping of the memory array and not the logic circuitry.
Figure 8B:
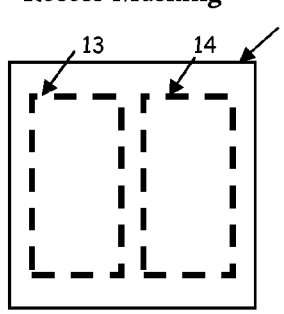
Figure 8C:
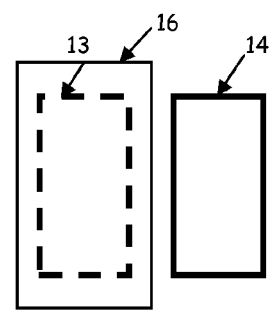

Referring to FIGS. 8a through 8c, FIG. 8a shows two types of areas of circuitry on a chip. The area of circuitry containing logic wiring is represented by 13, while the area of circuitry containing the top wiring of the memory, either bit lines or word lines, is represented by 14. FIG. 8b shows the application of one or more blanket capping liners 15 over both circuit areas 13 and 14. In a following step, FIG. 8c shows a block mask 16 which is applied lithographically to expose only the bit lines or word lines 14, while covering the logic circuitry 13. During a subsequent recess process, the logic circuitry 13 is protected from etching, while the bit lines or word lines 14 are etched so as to recess the metal conductor, resulting in the structure of FIG. 5. The block mask 16 is then stripped and the process steps shown in FIGS. 6 and 7 are performed in that order with the polish removing the capping layer or layers from the surface of the chip everywhere except in the recessed areas of the exposed circuit areas of the memory wiring 14.

While the embodiments, above, teach the inventive structure and method as used in circuitry including a memory circuit, the invention need not be limited to memory applications. Also, the materials for the layers making up the liners, need not be limited to those of ferromagnetic nor refractory materials.

The invention claimed is:

1. A method of forming interconnects, said interconnects comprising four sides, clad, on at least three of the four sides with a self-aligned liner, in a dielectric layer, said dielectric layer comprising a top and a bottom surface and formed over a semiconductor substrate surface, said method comprising:

etching one or more trenches in the top surface of the dielectric layer, each trench comprising two sides and a bottom;

coating the one or more trenches and the top surface of the dielectric layer with a first stack, said first stack comprising one of more layers, wherein at least one of the said one or more layers comprises a ferromagnetic material, to form a first liner;

anisotropically etching the first stack to remove at least the ferromagnetic layer from the horizontal surfaces of the trench bottoms and the top surface of the dielectric layer to form sidewall spacers in the one or more trenches;

coating at least the top surface of the dielectric layer with a refractory material to form a second liner;

filling the one or more trenches with a metal conductor and polishing the metal conductor, stopping on the second liner on the top surface of the dielectric;

recessing the metal conductor of one or more selected metal filled trenches by selectively etching the metal conductor of the one or more selected metal filled trenches, said selective etching being selective to the sidewall spacers;

forming, over the top surface of the dielectric layer and over the one or more trenches, a second stack, comprising one or more layers, wherein at least one of said one or more layers comprises a second ferromagnetic layer, said second stack forming a third liner; and polishing with a chemical-mechanical polish removing the second stack from the top surface of the dielectric layer and any non-recessed metal filled trenches while leaving the second stack over the recessed one or more selected metal filled trenches to form a capping layer over the recessed one or more selected metal filled trenches and a planar surface.

* * * * *